(12) United States Patent
Ashikaga

(10) Patent No.: US 6,411,540 B1
(45) Date of Patent: Jun. 25, 2002

(54) FERROELECTRIC RANDOM ACCESS MEMORY AND ITS OPERATING METHOD

(75) Inventor: Kinya Ashikaga, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/644,047

(22) Filed: Aug. 23, 2000

(30) Foreign Application Priority Data

Aug. 26, 1999 (JP) .......................................... 11-240069

(51) Int. Cl.[7] .............................................. G11C 11/22
(52) U.S. Cl. ...................................... 365/145; 365/203
(58) Field of Search ................................. 365/145, 149, 365/194, 196, 203, 202, 205

(56) References Cited

U.S. PATENT DOCUMENTS

| | | | | |
|---|---|---|---|---|
| 5,487,030 A | * | 1/1996 | Drab et al. ................. | 365/145 |
| 5,600,587 A | * | 2/1997 | Koike ........................ | 365/145 |
| 5,671,174 A | * | 9/1997 | Koike et al. ............... | 365/145 |
| 6,097,624 A | * | 8/2000 | Chung et al. .............. | 365/145 |
| 6,198,654 B1 | * | 3/2001 | Ashikaga ................... | 365/145 |

FOREIGN PATENT DOCUMENTS

| | | |
|---|---|---|
| JP | 09245485 | 9/1997 |
| JP | WO97/32311 | 9/1997 |
| JP | 2000-100176 | 4/2000 |

* cited by examiner

*Primary Examiner*—Richard Elms
*Assistant Examiner*—Hien Nguyen
(74) *Attorney, Agent, or Firm*—Venable; Robert J. Frank

(57) ABSTRACT

A ferroelectric memory device in which an imprint is prevented, and a method of operating the ferroelectric memory device to prevent its characteristics from deteriorating due to an imprint. The ferroelectric memory device includes a sense amplifier having first and second transistors which connect first and third sub-bit lines to a ground in accordance with a sense amplifier control signal, third and fourth transistors which connect the first sub-bit line with a fourth sub-bit line and further connect the third sub-bit line with a second sub-bit line in accordance with a first switching control signal, and fifth and sixth transistors which connect the first sub-bit line with the second sub-bit line and further connect the third sub-bit line with the fourth sub-bit line in accordance with a second switching control signal.

16 Claims, 7 Drawing Sheets

FIG. 9
(INVERTING OPERATION a)
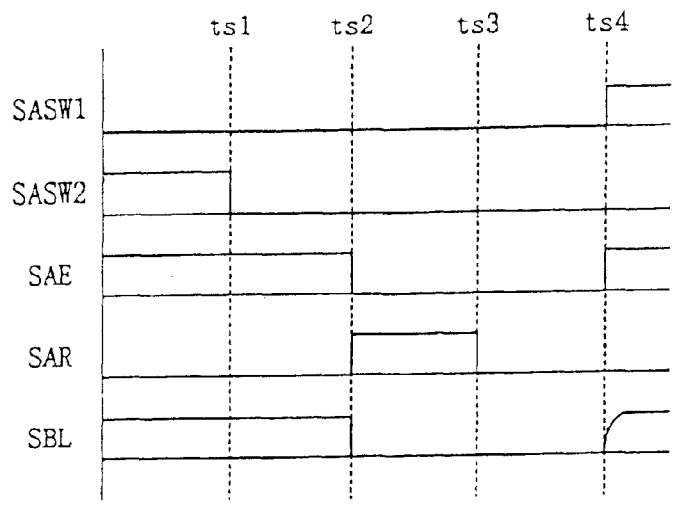
(INVERTING OPERATION b)
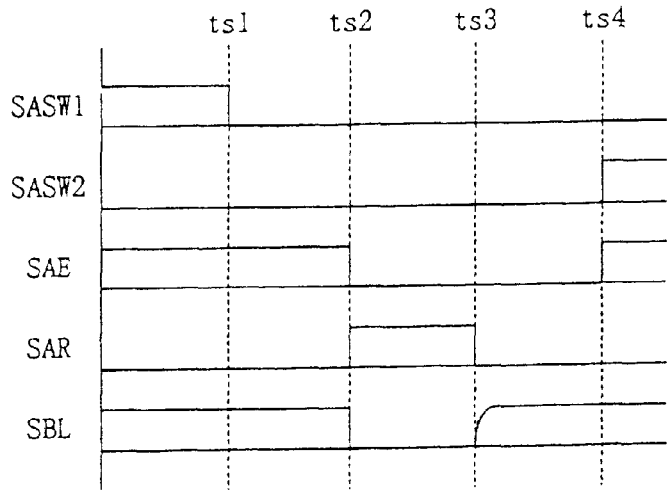

FERROELECTRIC RANDOM ACCESS MEMORY AND ITS OPERATING METHOD

BACKGROUND OF THE INVENTION

1. Field of the Invention

The present invention relates to a semiconductor device and a method of an operation thereof. More particularly, the present invention relates to a ferroelectric memory device and a method of an operation thereof.

2. Description of Related Art

In recent years, attention has been paid to a memory using a ferroelectric substance. It is possible for the ferroelectric memory device to be used as a non-volatile memory because dielectric polarization resides (residual polarization) after the electric power is turned off, if the polarization directions are aligned in one direction by applying a voltage to the ferroelectric substance once, since the ferroelectric memory device stores information using spontaneous polarization of the ferroelectric substance.

Further, a conventional non-volatile memory requires a high voltage of more than 10 V when data is written, and further the writing speed is in the order of micro seconds. On the other hand, it is possible for the ferroelectric memory device to reverse polarization using only several volts V, and the reverse speed is in the order of nano-seconds. In this way, the ferroelectric memory device is expected to be a next generation non-volatile memory capable of performing a low-voltage/high-speed operation.

The ferroelectric memory device is formed of a memory cell composed of a MOS transistor and a ferroelectric capacitor. The structure of the conventional ferroelectric memory device and the operation thereof are explained.

FIG. 1 shows the structure of the conventional ferroelectric memory device. Here, one of a plurality of memory cells is shown representatively. A memory cell 1 is formed of a transistor 3 and a ferroelectric capacitor 5. A gate of the transistor 3 is connected with a word line WL, a source is connected with a bit line BL, and a drain is connected with one terminal of the ferroelectric capacitor 5. The other terminal of the ferroelectric capacitor 5 is connected with a plate line PL. Further, the bit line BL is connected with a sense amp 7. When data is written to the memory cell 1, the transistor 3 is selected by way of the word line WL. Further, 0 V is applied to the bit line BL, and a positive voltage is applied to the plate line PL; accordingly dielectric polarization of the ferroelectric capacitor 5 is aligned towards the first direction from the electrode of the capacitor 5 connected to the plate line PL to the electrode of the capacitor 5 connected to the drain of the transistor 3, and the data "0" is written to the memory cell 1 as a result. On the other hand, if a positive voltage is applied to the bit line BL, and 0 V is applied to the plate line PL, dielectric polarization of the ferroelectric capacitor 5 is aligned towards the second direction opposite to the first direction, and the data "1" is written to the memory cell 1 as a result. When data stored in the memory cell 1 is read out, the bit line BL is pre-charged to 0 V, for example, and a positive voltage is applied to the plate line PL. At this time, the data "1" is stored in the memory cell 1 if the ferroelectric capacitor 5 is polarized towards the second direction, and the direction of dielectric polarization is reversed. On the contrary, when the data "0" is stored in the memory cell 1, and the ferroelectric capacitor 5 is polarized towards the first direction, the direction of dielectric polarization is not changed. The change of the direction of this dielectric polarization is reflected in the change of the voltage of the bit line BL. Thus, an electrical potential of the bit line BL is not the same depending on whether data stored in the memory cell 1 is "0" or "1." Further, the change of the voltage of the bit line BL is sensed by the sense amp 7, and the data "0" or "1" is read out.

In the sense amp 7, a reference voltage Vref is required to determine if data read out from the memory cell 1 is "0/1." In the conventional way, in order to obtain the reference voltage Vref, a technology has been proposed in which data in reverse is stored in a dummy data cell and data read from the cell. In this case, two transistors and two capacitors for storing complimentary data "0/1" per piece of information are required. This is defined as a transistor 2 capacitor (2T2C) type.

The change of the voltage of the bit line BL, when the data is read out from the memory cell 1, is caused by the change of a quantity of electric charge stored in a bit line capacitor CBL of the bit line BL. Here, an operation in which the conventional ferroelectric memory device is read out, is explained using FIG. 2.

FIG. 2 is a hysteresis property curve of the ferroelectric capacitor 5 shown in FIG. 1. Here, the slope of a straight line obliquely across the hysteresis curve indicates a bit line capacitor CBL. When data "1" is stored in the memory cell 1, the ferroelectric capacitor 5 is in a state AO. Here, when the predetermined voltage is applied to the plate line PL, the ferroelectric capacitor 5 transits to a state A1, and a voltage Va is detected in the bit line BL. On the other hand, when data "0" is stored in the memory cell 1, the ferroelectric capacitor 5 is in a state BO. Here, the predetermined voltage is applied to the plate line PL, the ferroelectric capacitor 5 transits to a state B1, and a voltage Vb is detected in the bit line BL. Therefore, a potential difference ΔV which has to be sensed by the sense amp 7 is Vb−Va, and it is required that the potential difference ΔV be as large as possible and scatter be as small as possible in order to read data precisely from the memory cell 1.

In the 2T2C type ferroelectric memory device, which has been fabricated for practical use, a read out operation as shown in FIG. 2 was performed.

SUMMARY OF THE INVENTION

Although the ferroelectric memory device appears to be superior with regard to operation speed and operation voltage, the 2T2C type has not been used widely for circuit integration. Thus, it has not attained the same level of use as the DRAM, which is the main device favored by designers at the present time. Accordingly, an 1T1C type ferroelectric memory device having a compact circuit fit for practical use has been anticipated.

However, in the conventional 1T1C type ferroelectric memory device, the character of the ferroelectric capacitor changes if the operation for reading out the data is performed repeatedly. In particular, there has been a possibility of reading out wrong data in the case that the reference voltage has been fixed. The following two facts have been known with regard to the change of the ferroelectric capacitor characteristics.

(1) A phenomenon (Fatigue: lassitude) in which the quantity of dielectric polarization of the ferroelectric substance is small if bipolar (two poles) pulses are applied repeatedly.

(2) A phenomenon (Imprint: impression) in which dielectric polarization is difficult to reverse if unipolar (one pole) pulses are applied to the ferro-dielectric capacitor repeatedly or a direct-current voltage is applied thereto continuously.

Pursuant to the phenomenon (1), in recent years, a ferro-dielectric material and an electrode material, which would hardly cause the fatigue phenomenon, have been researched and developed, and thus this problem is about to be resolved.

On the other hand, pursuant to the phenomenon (2), an effective means has not yet been found. In addition, it is required to guarantee operation at a temperature of 80° C. in order to equip the ferro-dielectric memory device with a logic IC, for example, however, it has become obvious that an imprint has become noticeable under this temperature.

As shown in the foregoing, a deterioration of the characteristics by the imprint has been one of the main factors obstructing making the 1T1C type ferro electric memory device fit for practical use.

The present invention has been invented in the light of the above-mentioned problems; the purpose thereof is to provide a ferro-dielectric memory device, in which the deterioration of the characteristics by the imprint is prevented, and a method for operating the ferro-dielectric memory device in which the deterioration of the characteristics by the imprint is prevented.

In order to solve the above-mentioned object, in the production method of a semiconductor device of the present invention, so as to solve the above mentioned problems, the ferro-dielectric memory device is provided, in which there are included a plurality of memory cells for storing data by polarization of a ferroelectric capacitor; a bit line to which each of the memory cells is connected; a pre-charge circuit, which is connected to one terminal of the bit line through a fifth switch unit, for providing a pre-charge voltage to the bit line; a first sub-bit line being connected to the other terminal of the bit line through a first switch unit; a data line for transmitting data being read out from each of the memory cells and data being written in each of the memory cells; a second sub-bit line being connected to the data line by way of a second switch unit; and a sense amp unit to which the first sub-bit line and the second sub-bit line are connected. Further, such a sense amp unit is characterized in that there are included a latch type sense amp for detecting the voltage of the first sub-bit line and for latching the voltage of the first sub-bit line at a predetermined level determined by a reference voltage; a grounding circuit connecting the first sub-bit line to a ground; a second transferring circuit for transferring a voltage logical level of the second sub-bit line to the first sub-bit line; and a first transferring circuit for transferring a voltage logical level, which is the reverse of the voltage logical level of the second sub-bit line, to the first sub-bit line.

BRIEF DESCRIPTION OF THE DRAWINGS

FIG. 9 is a timing chart showing an operation for reversing the voltage of a pair of sub-bit lines when the data of the ferro-dielectric memory of FIG. 3 is being read out and written.

DETAILED DESCRIPTION OF THE INVENTION

The preferred embodiment of a ferroelectric memory device and a method of operation thereof in accordance with the present invention are explained in detail with reference to the accompanying drawings. Here, the explanation has been simplified by employing the same reference numbers for components having the same functions and structures.

Figure 3:
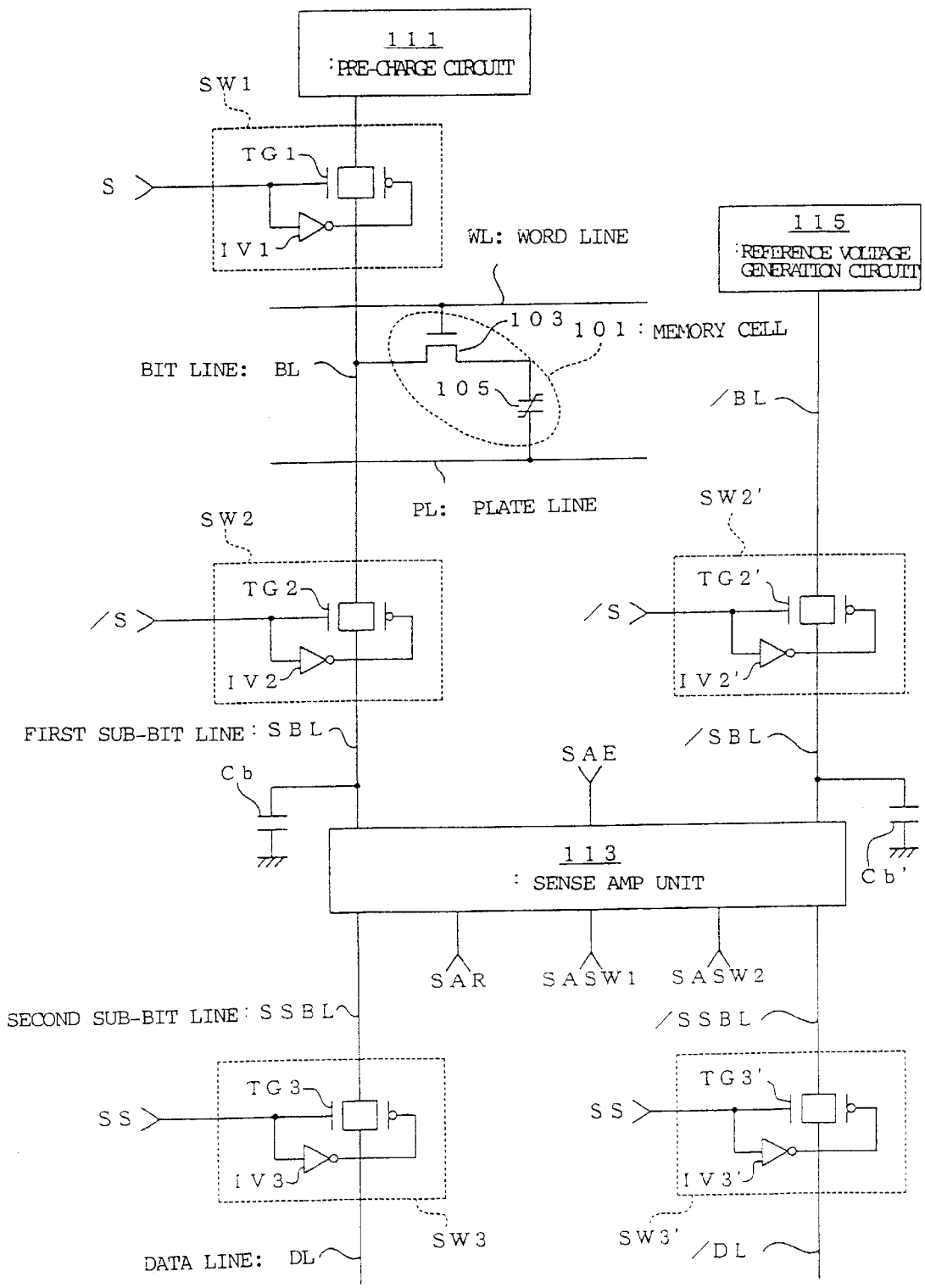
FIG. 3 is a circuit diagram showing a ferro-dielectric memory in accordance with the preferred embodiment of the present invention.

The ferroelectric memory 100 according to the present invention is shown in FIG. 3. The ferroelectric memory 100 includes a plurality of memory cells, a pre-charge circuit 111, a sense amp unit 113, a reference voltage generating circuit 115, a fifth switch unit SW1, a first switch unit SW2, a third switch unit SW2', a second switch unit SW3, a fourth switch unit SW3', a word line WL, a plate line PL, first and second bit lines BL and /BL respectively, a first sub-bit line SBL, a third sub-bit line /SBL, a second sub-bit line SSBL, a fourth sub-bit line /SSBL, a pair of data lines DL and /DL, and capacitors Cb and Cb'. Here, FIG. 3 shows a memory cell 101 among a plurality of memory cells.

The memory cell 101 includes a transistor 103 and a ferroelectric capacitor 105. The gate of the transistor 103 is connected to the word line WL, the source thereof is connected to the bit line BL, and the drain thereof is connected to one terminal of the ferroelectric capacitor 105. The other terminal of the ferroelectric capacitor 105 is connected to the plate line PL.

The fifth switch unit SW1 is composed of a first transfer gate TG1 and a first inverter IV1. The first transfer gate TG1 electrically connects one terminal of the bit line BL with the pre-charge circuit 111 by way of a logically inverted signal of a first control signal S, generated by the first control signal S and the first inverter IV1.

The first switch unit SW2 is composed of a second transfer gate TG2 and a second inverter IV2. The second transfer gate TG2 electrically connects the other terminal of the bit line BL with one terminal of the first sub-bit line SBL by way of a logically inverted signal of a second control signal /S, generated by the second control signal /S and the second inverter IV2.

The third switch unit SW2' is composed of a second transfer gate TG2' and a second inverter IV2'. The second transfer gate TG2' electrically connects one terminal of the third sub-bit line /SBL with the bit line /BL, one terminal of which is connected to a reference voltage generating circuit 115, by way of a logically inverted signal of the second control signal /S generated by the second control signal /S and the second inverter IV2'.

Each terminal of the first and third sub-bit lines SBL and /SBL respectively is connected to the sense amp unit 113. Further, one terminal of each of the capacitors Cb and Cb' is connected to the first and third sub-bit lines SBL and /SBL respectively, and the other terminal of each of the capacitors is connected to a ground in order to regulate the capacitors.

The second switch unit SW3 is composed of a third transfer gate TG3 and a third inverter IV3. The third transfer gate TG3 electrically connects the data line DL with a terminal of the second sub-bit line SSBL, one terminal of which is electrically connected to the sense amp unit 113 by way of a logically inverted signal of a third control signal SS generated by the third control signal SS and the third inverter IV3.

The fourth switch unit SW3' is composed of a third transfer gate TG3' and a third inverter IV3'. The third transfer gate TG3' electrically connects the data line /DL with a terminal of the second sub-bit line /SSBL, one terminal of which is electrically connected to the sense amp unit 113 by way of a logically inverted signal of the third control signal SS generated by the third control signal SS and the third inverter IV3'.

Figure 4:
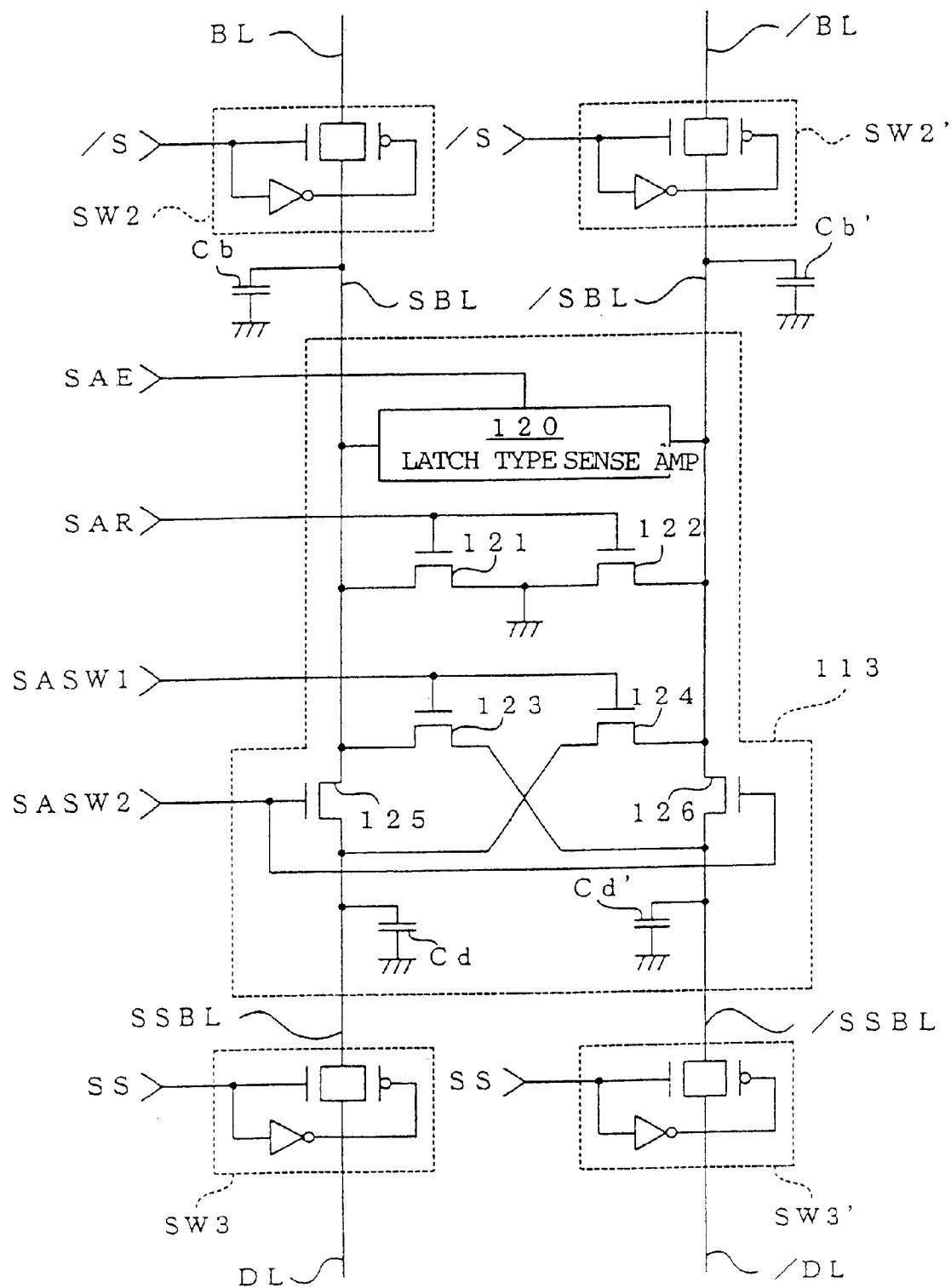
FIG. 4 is a circuit diagram showing the structure of a sense amp unit provided in the ferro-dielectric memory of FIG. 3.

Next, the circuit diagram of the sense amp unit 113 is explained using FIG. 4. The sense amp unit 113 includes a latch type sense amp 120, first to sixth transistors 121, 122, 123, 124, 125, and 126, and capacitors Cd and Cd'.

The latch type sense amp 120 is activated by a sense amp enable signal SAE, and connected to a pair of the first sub-bit lines SBL and /SBL.

The first transistor 121 and the second transistor 122 are formed in such a way as to be ON/OFF controlled by a sense amp control signal SAR input to the gates of these transistors. Further, the drain of the first transistor 121 is connected to the first sub-bit line SBL, and the drain of the second transistor 122 is connected to the first sub-bit line /SBL. The sources of the first transistor 121 and the second transistor 122 are grounded together.

The third transistor 123 and the fourth transistor 124 as the first transferring means are formed in such a way as to be ON/OFF controlled by a first switching control signal SASW1 input to the gates of these transistors. Further, the drain of the third transistor 123 is connected to the first sub-bit line SBL, and the drain of the fourth transistor 124 is connected to the first sub-bit line /SBL. The source of the third transistor 123 is connected to the second sub-bit line /SSBL, and the source of the fourth transistor 124 is connected to the second sub-bit line SSBL.

The fifth transistor 125 and the sixth transistor 126 as the second transferring means are formed in such a way as to be ON/OFF controlled by a second switching control signal SASW2 input to the gates of these transistors. Further, the drain of the fifth transistor 125 is connected to the first sub-bit line SBL, and the drain of the sixth transistor 126 is connected to the first sub-bit line /SBL. The source of the fifth transistor 125 is connected to the second sub-bit line SSBL and the source of the sixth transistor 126 is connected to the second sub-bit line /SSBL.

One terminal of the capacitor Cd is connected to the second sub-bit line SSBL, and the other terminal of the capacitor Cd is grounded. One terminal of the capacitor Cd' is connected to the second sub-bit line /SSBL, and the other terminal of the capacitor Cd' is grounded.

The operation of the ferroelectric memory 100 according to the preferred embodiment of the present invention is explained hereinafter.

Figure 5:
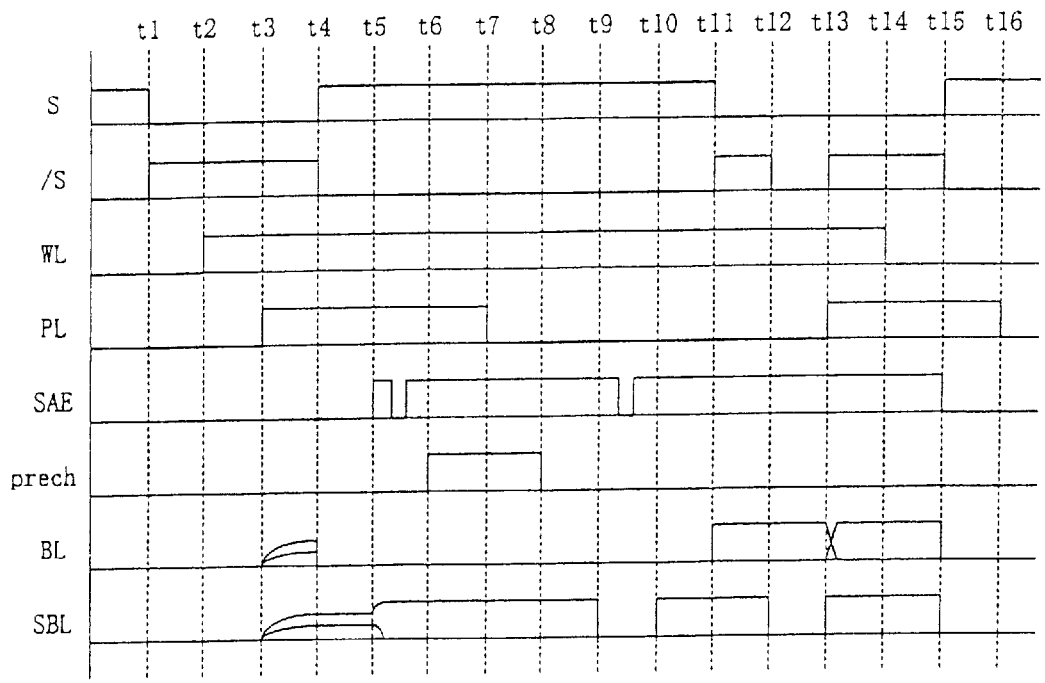
FIG. 5 is a timing chart showing the read out of data from the ferro-dielectric memory of FIG. 3.
Figure 6:
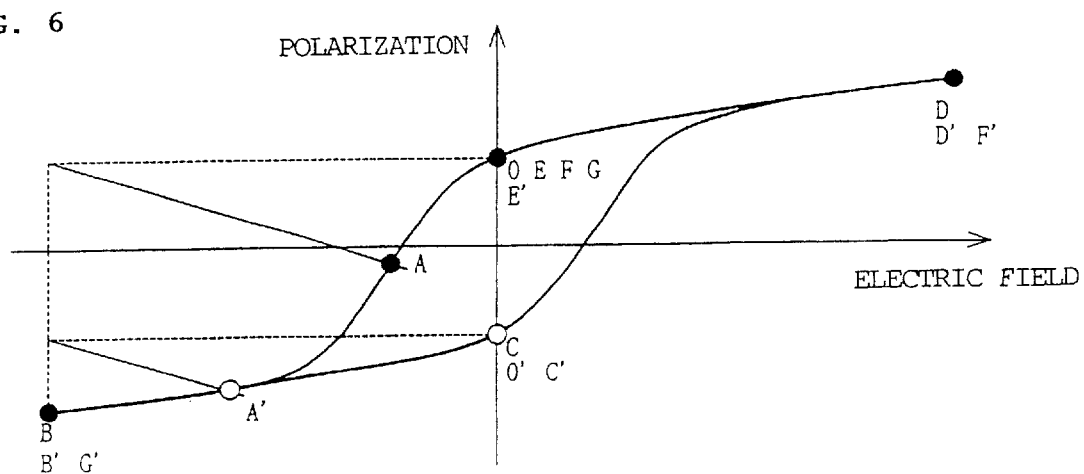
FIG. 6 is a hysteresis characteristic curve of the ferro-dielectric capacitor when data of the ferro-dielectric memory of FIG. 3 is being read out.

First of all, the operation of reading out data of the ferroelectric memory 100 is explained using FIG. 5 and FIG. 6. When the operation of reading out the data is performed, the bit line BL is pre-charged by the pre-charge circuit 111 until the ground voltage is reached.

At a timing point t0 (initial condition) shown in FIG. 5, the ferroelectric capacitor 105 is in the state 0 shown in FIG. 6 when data in the form of a binary "0" is stored in the memory cell 101, and the ferroelectric capacitor 105 is in the state 0' when data in the form of a binary "1" is stored in the memory cell 101.

At the timing point t1, the first control signal S is set to a logicaly low level ("L level" hereinafter), and the second control signal /S is set to a logically high level ("H level" hereinafter). Thus, the fifth switch unit SW1 turns to an OFF state, and the first switch unit SW2 turns to an ON state. Therefore, the bit line BL is separated electrically from the pre-charge circuit 111, and is electrically connected to the first sub-bit line SBL.

At a timing point t2, the word line WL is changed to the H level.

At a timing point t3, the plate line PL is changed to the H level. Then, the ferroelectric capacitor 105 transits to the state A when the state 0 is set, and it transits to the state A' when the state 0' is set.

At a timing point t4, the first control signal S is changed to the H level, and the second control signal /S is changed to the L level. Thus, the fifth switch unit SW1 is turned to the ON state, and the first switch unit SW2 is turned to the OFF state. Therefore, the bit line BL is separated from the first sub-bit line SBL, connected electrically to the pre-charge circuit 111, and turned to a ground electrical potential. At this stage, the ferroelectric capacitor 105 transits from the state A to the state B, or from the state A' to the state B'.

At a timing point t5, the sense amp enable signal SAE is set to the H level, and the latch type sense amp 120 provided in the sense amp unit 113 is turned to an enable state. Further, the sense amp unit 113 compares the voltage of the first sub-bit line SBL with the reference voltage Vref output from the reference voltage generating circuit 115 and applied to the third sub-bit line /SBL; the first sub-bit line SBL is latched to the H level if the voltage of the first sub-bit line SBL is higher than Vref, and the first sub-bit line SBL is latched to the L level if the voltage of the first sub-bit line SBL is lower than Vref.

At a timing point t6, the pre-charge voltage prech output from the pre-charge circuit 111 is set to the H level. At this stage, the ferroelectric capacitor 105 transits to a state C if it is in the state B, or to a state C' if it is in the state B'.

At a timing point t7, the plate line PL is set to the L level (the ground electrical potential). At this stage, the ferroelectric capacitor 105 transits to a state D if it is in the state C or to a state D' if it is in the state C'.

At a timing point t8, the pre-charge voltage prech is set to the L level (the ground electrical potential). At this stage, the ferroelectric capacitor 105 transits to a state E if it is in the state D or to a state E' if it is in the state D'.

The latch voltage of the first sub-bit line SBL is inverted between a timing point t9 and a timing point t10 (inverting operation a: described hereinafter).

At a timing point t11, the second control signal /S is turned to the H level. Thus, the first switch unit SW2 turns to the ON state, the first sub-bit line SBL is connected electrically to the bit line BL, and the latch voltage of the first sub-bit line SBL is transmitted to the bit line BL. At this stage, the ferroelectric capacitor 105 transits to a state F if it is in the state E or to a state F' if it is in the state E'.

The second control signal /S is turned to the L level at any time between a timing point t12 and a timing point t13, and the latch voltage of the first sub-bit line SBL is inverted (inverting operation b: described hereinafter).

At a timing point t13, the second control signal /S is turned back to the H level, and the plate line PL is also turned to the H level. At this stage, the ferroelectric capacitor 105 transits to a state G if it is in an F state, and to a state G' if it is in an F' state.

At a timing point t14, the word line WL is turned to an L level.

At a timing point t15, the first control signal S is turned to the H level, and the second control signal /S is turned to the L level. Thus, the fifth switch unit SW1 turns to the ON state, and the first switch unit SW2 turns to the OFF state. Thus, the bit line BL is separated electrically from the first sub-bit line SBL, and connected electrically to the pre-charge circuit 111. Further, the sense amp enable signal SAE is turned to the L level, and the latch type sense amp 120 equipped with the sense amp unit 113 is turned to a disabled state.

At a timing point t16, the plate line PL is turned to the L level.

Thus, it is accomplished to read out a series of data.

Here, a transition state of the ferroelectric capacitor 105 is noted, in which the ferroelectric memory 100 in accordance with the present invention shown in FIG. 6 is read out.

First of all, when the ferroelectric capacitor 105 is in an initial state 0, the sequence of transition states thereafter is

0→A→B→C→D→E→F→G.

This transition sequence indicates that one positive pulse and one negative pulse are applied to the ferroelectric capacitor 105 respectively, during the operation of reading out data once. Namely, a transition from the state 0 to the state C is established by applying a negative pulse, and a transition from the state C to the states E, F, and G is established by applying a positive pulse.

On the other hand, when the ferroelectric capacitor 105 is in an initial state 0', the sequence transition states thereafter is

0'→A'→B'→C'→D'→E'→F'→G'.

This transition sequence indicates that two positive pulses and two negative pulses are applied to the ferroelectric capacitor 105 respectively during the operation of reading out data once. Namely, a transition from the state 0' to the state C' is established by applying the first negative pulse, a transition from the state C' to the states E' is established by applying the first positive pulse, and a transition from the state E' to the states G' through to a state F' is established by applying the second positive pulse and the second negative pulse.

Thus, according to the ferroelectric memory 100 of the preferred embodiment of the present invention, when data is read out from a predetermined memory cell, one positive pulse or two positive pulses is/are applied to the ferroelectric memory equipped in this memory cell respectively, in a well balanced manner. Therefore, an imprint phenomenon caused by repeatedly performing the reading out operation is suppressed.

Figure 7:
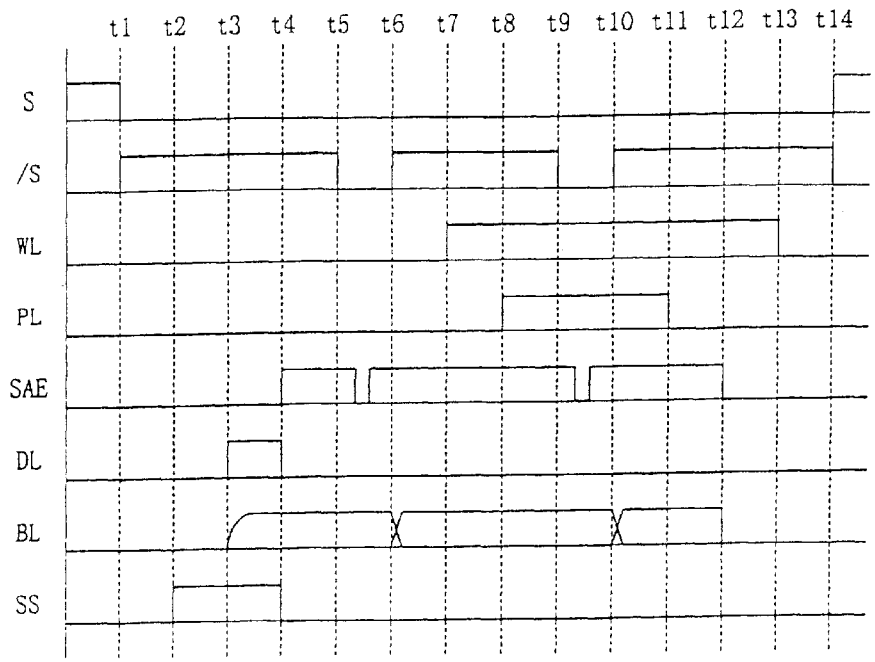
FIG. 7 is a timing chart showing the writing of data into the ferro-dielectric memory of FIG. 3.
Figure 8:
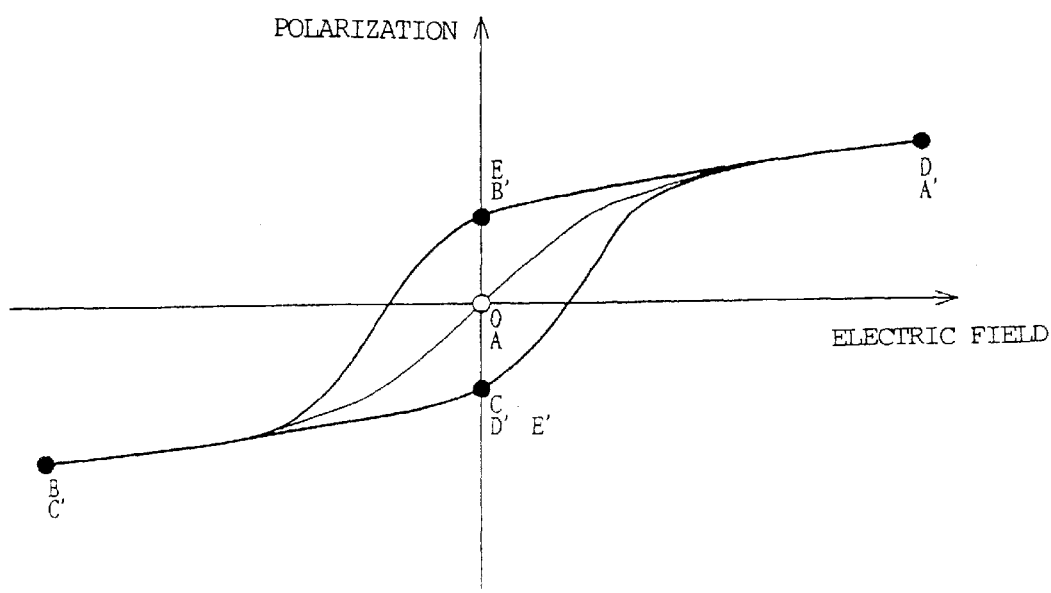
FIG. 8 is a hysteresis characteristic curve of the ferro-dielectric capacitor when data of the ferro-dielectric memory of FIG. 3 is being written.

Next, the operation in which data is written to the ferroelectric memory 100 is explained, with reference to FIG. 7 and FIG. 8.

At the timing point t1, the first control signal S is set to the L level, and the second control signal /S is set to the H level. Thus, the fifth switch unit SW1 turns to the OFF state, and the first switch unit SW2 turns to the ON state. Therefore, the bit line BL is separated electrically from the pre-charge circuit 111, and connected electrically to the first sub-bit line SBL.

At the timing point t2, the third control signal SS is set to the H level. Thus, the second switch unit SW3 turns to the ON state. As a result, the second sub-bit line SSBL is connected electrically to the data line DL, and a condition of waiting for data from the data line DL is caused.

At the timing point t3, the voltage (H level or L level) corresponding to the written data is applied to the data line DL. Further, a voltage having a complimentary relationship with the data line DL is applied to the data line /DL. The level of each voltage of the pair of bit lines BL and /BL changes corresponding to the change of the level of each voltage of the pair of data lines DL and /DL.

At the timing point t4, the third control signal SS is set to the L level, and the data line DL is set to the L level. Further, the sense amp enable signal SAE is set to the H level, and the latch type sense amp 120 is set to the enable state.

At the timing point t5, the second control signal /S is set to the L level, and the latch voltage of the first sub-bit line SBL is inverted between the timing point t5 and the timing point t6 (inverting operation a: described hereinafter).

At the timing point t6, the second control signal /S is turned once more to the H level. Thus, the first switch unit SW2 is turned to the ON state, the first sub-bit line SBL is connected electrically to the bit line BL, and the latch voltage of the first sub-bit line SBL is transferred to the bit line BL. Here, when the bit line BL has been at the H level, the bit line BL is latched to the L level, and to the H level when it has been at the L level.

At the timing point t7, the word line WL is set to the H level. When it is attempted to write data "0" to the memory cell 101, the ferroelectric capacitor 105 transits from the state 0 to the state A (there is no change in dielectric polarization). When it is attempted to write data "1" to the memory cell 101, the ferroelectric capacitor 105 transits from the state 0 to the state A'.

At the timing point t8, the plate line PL is set to be the H level. At this stage, the ferroelectric capacitor 105 transits to the state B when it is in the state A, and to the state B' when it is in the state A'.

At the timing point t9, the second control signal /S is set to the L level, and the latch voltage of the first sub-bit line SBL is inverted between the timing point t9 and the timing point t10 (inverting operation b: described hereinafter).

At the timing point t10, the second control signal /S is set to the H level. Thus, the first switch unit SW2 turns to the ON state, the first sub-bit line SBL is connected electrically to the bit line BL, and the latch voltage of the first sub-bit line SBL is transferred to the bit line BL. At this time, the ferroelectric capacitor 105 transits to the state C if it is in the state B, and to the state C' if it is in the state B'.

At the timing point t11, the plate line PL is set to the L level. At this time, the ferroelectric capacitor 105 transits to the state D when it is in the state C, and to the state D' when it is in the state C'.

At the timing point t12, the sense amp enable signal SAE is set to the L level. At this time, the ferroelectric capacitor 105 transits to the state E when it is in the state D, and to the state E' when it is in the state D'.

At the timing point t13, the word line WL is set to the L level.

At the timing point t14, the first control signal S is set to the H level, and the second control signal /S is set to the L level. Thus, the fifth switch unit SW1 turns to the ON state, and the first switch unit SW2 turns to the OFF state. Therefore, the bit line BL is separated electrically from the first sub-bit line SBL, and connected electrically to the pre-charge circuit 111.

In accordance with the foregoing description, the operation of writing a series of data to the memory cell 101 is performed.

Here, a transition state of the ferroelectric capacitor 105 is noted, in which the ferroelectric memory 100 in accordance with the present invention shown in FIG. 8 is read out.

First of all, when the data "0" is written to the ferroelectric capacitor 105, the sequence of transition states thereafter is

0→A→B→C→D→E.

This transition sequence indicates that one positive pulse and one negative pulse are applied to the ferroelectric capacitor 105 respectively during the operation of reading out data once. Namely, a transition from the states 0 and A to the state C is established by applying a negative pulse, and a transition from the state C to the state E is established by applying a positive pulse.

On the other hand, when the data "1" is written to the ferroelectric capacitor 105, the transition sequence thereafter is

0→A'→B'→C'→D'→E'.

This transition sequence indicates that one positive pulse and one negative pulse are applied to the ferroelectric capacitor 105 respectively during the operation of reading out data once. Namely, a transition from the state 0 to the state B' is established by applying a positive pulse, and a transition from the state B' to the states D', E' is established by applying a negative pulse.

In this way, according to the ferroelectric memory 100 of the preferred embodiment of the present invention, one positive pulse and one negative pulse are applied to the ferroelectric memory in a good balanced manner. Therefore, the imprint phenomenon caused by repeatedly performing the writing operation is suppressed.

Next, the inverting operations a and b are explained with reference to FIG. 9, Here, the inverting operation a in the data read out operation is performed between the timing point t5 and the timing point t6 of FIG. 5, and the inverting operation b is performed between the timing point t9 and the timing point t10 of FIG. 5. Further, the inverting operation a in the data writing operation is performed between the timing point t5 and the timing point t6 of FIG. 5, and the inverting operation b is performed between the timing point t9 and the timing point t10 of FIG. 7.

(Inverting Operation a)

First of all, the second control signal /S is set to the L level. Further, the first switching control signal SASW1 is at the L level until a timing point ts4 is attained, and the third transistor 123 and the fourth transistor 124 provided in the sense amp unit 113 are in the OFF states.

At a timing point ts1, the second switching control signal SASW2 is set to the L level. Accordingly, the fifth transistor 125 and the sixth transistor 126 turn to the OFF states. Therefore, a pair of the first and third sub-bit lines SBL and /SBL and a pair of the second and fourth sub-bit lines SSBL and /SSBL are disconnected electrically.

At a timing point ts2, the sense amp enable signal SAE is set to the L level, and the latch type sense amp 120 is set to the disable condition. Further, the sense amp control signal SAR is set to the H level between a timing point ts2 and the timing point ts3. Accordingly, the first transistor 121 and the second transistor 122 turn to the ON states, and a pair of the first and third sub-bit lines SBL and /SBL turn to the L level. On the other hand, the former voltage level is maintained in the second and fourth sub-bit lines SSBL and /SSBL.

At a timing point ts4, the first switching control signal SASW1 is set to the H level. Accordingly, the third transistor 123 and the fourth transistor 124 turn to the ON conditions. Further, the first sub-bit line SBL is connected electrically to the second sub-bit line /SSBL, and the first sub-bit line /SBL is connected electrically to the second sub-bit line SSBL. Therefore, the voltage (data) of the second sub-bit line SSBL is transferred to the first sub-bit line /SBL, and the voltage (data) of the second sub-bit line /SSBL is transferred to the first sub-bit line SBL. At this time, the sense amp enable signal SAE is set to the H level, and the latch type sense amp 120 is set to the enable state. Accordingly, the voltage (data), which is the reverse of the voltage before the inverting operation a is performed, is latched to the first and third sub-bit lines SBL and /SBL.

(Inverting Operation b)

First of all, the second control signal /S is set to the L level. Further, the second switching control signal SASW2 is set to the L level until the timing point ts4 is attained, and the fifth transistor 125 and the sixth transistor 126 provided in the sense amp unit 113 are in the OFF states.

At a timing point ts1, the first switching control signal SASW1 is set to the L level. Accordingly, the third transistor 123 and the fourth transistor 124 turn to the OFF states. Therefore, the first and third sub-bit lines SBL and /SBL and the second and fourth sub-bit lines SSBL and /SSBL are disconnected electrically.

At a timing point ts2, the sense amp enable signal SAE is set to the L level, and the latch type sense amp 120 is set to the disable condition. Further, the sense amp control signal SAR is set to the H level between a timing point ts2 and the timing point ts3. Accordingly, the first transistor 121 and the second transistor 122 turn to the ON states, and the first and third sub-bit lines SBL and /SBL turn to the L level. On the other hand, the former voltage level is maintained in the second and fourth sub-bit lines SSBL and /SSBL.

At a timing point ts4, the second switching control signal SASW2 is set to the H level. Accordingly, the fifth transistor 125 and the sixth transistor 126 turn to the ON conditions. Further, the first sub-bit line SBL is connected electrically to the second sub-bit line SSBL, and the third sub-bit line /SBL is connected electrically to the fourth sub-bit line /SSBL. Therefore, the voltage (data) of the second sub-bit line SSBL is transferred to the first sub-bit line SBL, and the voltage (data) of the fourth sub-bit line /SSBL is transferred to the third sub-bit line /SBL. At this time, the sense amp enable signal SAE is set to the H level, and the latch type sense amp 120 is set to the enable state. Accordingly, the voltage (data), which is, the reverse of the voltage before the inverting operation b is performed, is latched to the first and third sub-bit lines SBL and /SBL.

In the foregoing description, the data read out operation from the memory cell 101 and the data write operation to the memory cell 101 are explained separately; in accordance with the memory cell 101 pursuant to the preferred embodiment of the present invention, the imprint phenomenon can be avoided even if any of the data read out operation and the data write operation are performed. Therefore, it becomes possible to manufacture the ferroelectric memory device, especially 1T1C type ferroelectric memory device, capable of storing and reading out data stably even if the data read/write operation is performed repetitively.

Here, the preferred embodiments of the present invention have been explained with reference to the accompanying drawings. However, the present invention is not limited to such preferred embodiments. It is obvious to a person skilled in the art to be able to attain various types of substituted examples or modified examples within the scope of the technical concept recited in the scope of the patent claims, and further it is obvious for such an issue to be included in the technical scope of the present invention in a natural manner.

Figure 1:
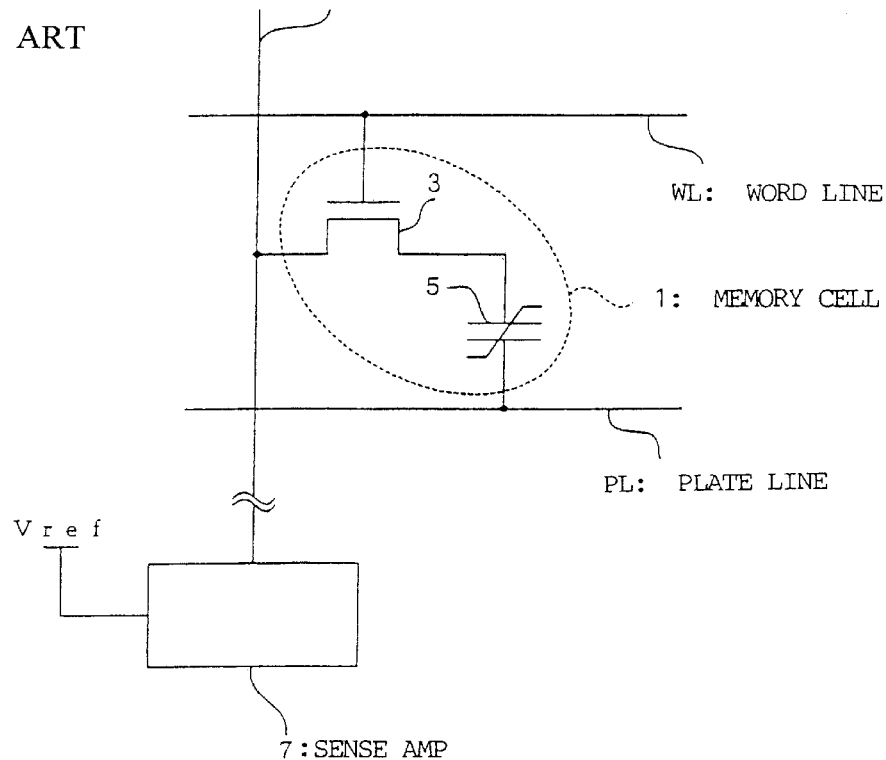
FIG. 1 is a circuit diagram showing the structure of a general ferro-dielectric memory.
Figure 2:
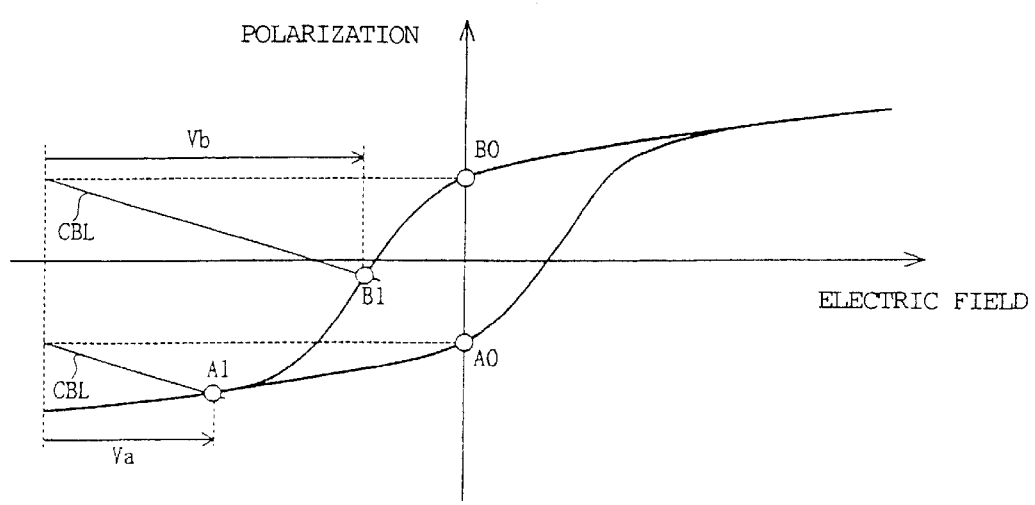
FIG. 2 is a hysteresis characteristic curve of a ferro electric capacitor when data of a conventional ferroelectric memory is being read out.
Figure 10:
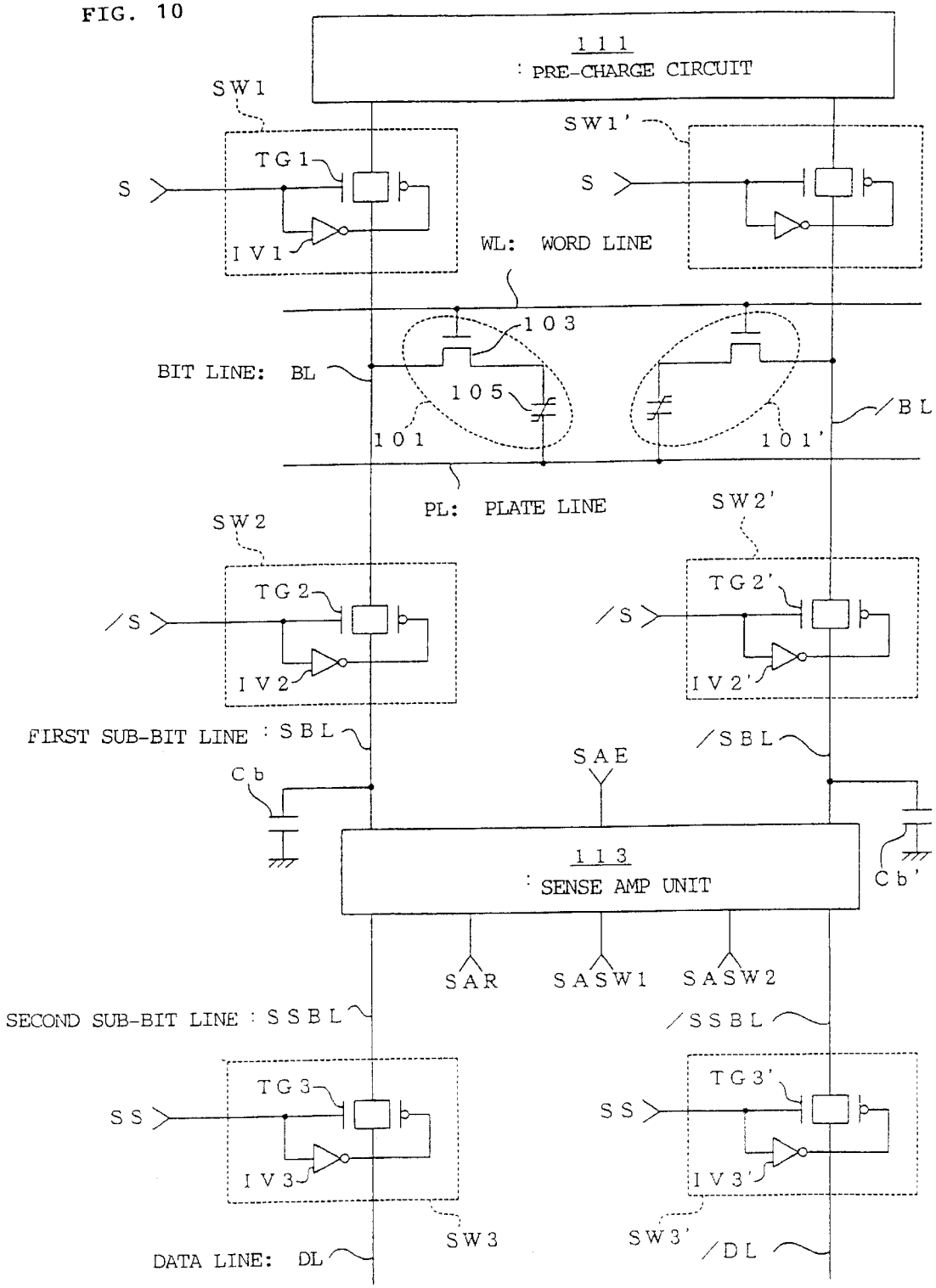
FIG. 10 is a circuit diagram showing a structure of another ferro-dielectric memory in accordance with the preferred embodiment of the present invention.

For example, the preferred embodiment of the present invention is described using a 1T1C type ferroelectric memory 100. However, the present invention is not limited to such a thing; further it is also applicable to apply 2T2C type ferroelectric memory as shown in FIG. 10. In such a case, the pre-charge voltage prech, which is output from the pre-charge circuit 111 through the switch unit SW1' having nearly the same structure as the fifth switch unit SW1 shown in FIG. 1, is applied to the bit line /BL to which the dummy cell 101' is connected.

As mentioned above, according to the present invention, it is possible to prevent the characteristics of a ferroelectric capacitor from deteriorating by the imprint. Therefore, stable operation is achieved while the size of the circuit is minimized as much as possible without causing errors when data is written and read out.

As described in the mentioned above, according to the present invention, it is possible to prevent the characteristics of a ferroelectric capacitor from deteriorating by the imprint. Therefore, it is achieved to operate stably while the size of a circuit is minimized as much as possible without causing errors when data is written and read out.

What is claimed is:

1. A ferroelectric memory device, comprising:
   a plurality of memory cells for storing data by polarization of a ferroelectric capacitor;
   a bit line connected to each of said memory cells;
   a pre-charge circuit connected to a terminal of said bit line through a fifth switch unit, said pre-charge circuit providing a pre-charge voltage to said bit line;
   a first sub-bit line connected to another terminal of said bit line through a first switch unit;
   a data line, said data line transmitting data read out from each of said memory cells and data written into each of said memory cells;
   a second sub-bit line connected to said data line by a second switch unit; and
   a sense amp unit connected to said first sub-bit line and said second sub-bit line, wherein said sense amp unit comprises:
      a latch type sense amp, said sense amp detecting a voltage of said first sub-bit line and latching the voltage of said first sub-bit line at a predetermined level determined by a reference voltage;
      a grounding circuit connected between said first sub-bit line and a ground;
      a second transferring circuit for transferring a voltage logical level of said second sub-bit line to said first sub-bit line; and
      a first transferring circuit for transferring a voltage logical level, which is the reverse of the voltage logical level of said second sub-bit line, to said first sub-bit line.

2. A ferroelectric memory device according to claim 1, wherein said sense amp unit includes a complementary fourth sub-bit line having a complementary relationship with said second sub-bit line, and said first transferring means transfers the voltage logical level of said complementary fourth sub-bit line to said first sub-bit line.

3. A ferroelectric memory device according to claim 1, wherein said pre-charge circuit outputs one of a voltage having a logical low level and a voltage having a logical high level as a pre-charge voltage.

4. A ferroelectric memory device according to claim 3, wherein a capacitor is connected to said second sub-bit line.

5. A ferroelectric memory device according to claim 2 wherein said pre-charge circuit outputs one of a voltage having a logical low level and a voltage having a logical high level as a pre-charge voltage.

6. A ferroelectric memory device comprising:
   a pair of bit lines including a first bit line and a second bit line;
   a plurality of memory cells connected to the first bit line;
   a pre-charge circuit connected to one end of the first bit line for providing a pre-charge voltage to the first bit line;
   a first sub-bit line connected to the other end of the first bit line through a first switch;
   a pair of data lines for transmitting data for the memory cells, including a first data line and a second data line;
   a second sub-bit line connected to the first data line through a second switch;
   a reference voltage generator connected to one end of the second bit line for providing a reference voltage;
   a third sub-bit line connected to the other end of the second bit line through a third switch;
   a fourth sub-bit line connected to the second data line through a fourth switch; and
   a sense amplifier connected to the first to fourth sub-bit lines.

7. A ferroelectric memory device according to claim 6, wherein the pre-charge voltage is a ground voltage.

8. A ferroelectric memory device according to claim 6, wherein the pre-charge voltage is a logical high level voltage.

9. A ferroelectric memory device according to claim 6, further comprising a capacitor connected to the first sub-bit line.

10. A ferroelectric memory device according to claim 6, further comprising a capacitor connected to the third sub-bit line.

11. A ferroelectric memory device according to claim 6, wherein the first and third switches are activated by a first signal.

12. A ferroelectric memory device according to claim 6, wherein the second and fourth switches are activated by a second signal.

13. A ferroelectric memory device according to claim 6, wherein the pre-charge circuit is connected to one end of the first bit line through a fifth switch.

14. A ferroelectric memory device according to claim 6, wherein said sense amplifier comprises:
   a latch type sense amplifier connected to the first and third sub-bit lines;
   a voltage fixing circuit connected to the first and second sub-bit lines, the voltage fixing circuit applying a fixed voltage to the first and second sub-bit lines;
   a first transferring circuit connected to the first through fourth sub-bit lines, the first transferring circuit transferring a logical voltage level on the first sub-bit line to the fourth sub-bit line and a logical voltage level on the third sub-bit line to the second sub-bit line, and
   a second transferring circuit connected to the first through fourth sub-bit lines, the second transferring circuit transferring the logical voltage level on the first sub-bit line to the second sub-bit line, and the logical voltage level on the third sub-bit line to the fourth sub-bit line.

15. A ferroelectric memory device according to claim 14, wherein the latch type sense amplifier detects voltages appearing on the first and third sub-bit lines and latches voltages of the first and second bit lines in response to the detected result.

16. A ferroelectric memory device according to claim 14, wherein the fixed voltage is a ground voltage.

* * * * *